United States Patent [19]

Bajka

[11] 4,292,542
[45] Sep. 29, 1981

[54] SUBMERSIBLE REMOTE CONTROL SWITCH ASSEMBLY

[75] Inventor: Peter Bajka, Los Altos, Calif.

[73] Assignee: Compool Corporation, Mountain View, Calif.

[21] Appl. No.: 140,162

[22] Filed: Apr. 14, 1980

[51] Int. Cl.³ ............................................. H02J 13/00
[52] U.S. Cl. ....................................... 307/28; 307/29;
  307/75; 307/115; 307/326; 361/191; 307/38;
  307/42
[58] Field of Search ............ 307/28, 29, 26, 4, 38–41,
  307/42, 75, 114, 115, 157, 326; 315/159, 161,
  162, 314, 315, 317, 320; 361/191; 335/1, 159,
  164, 206

[56] References Cited

U.S. PATENT DOCUMENTS 3,493,902 2/1970 Watlington ............................ 335/1
4,187,483 2/1980 Whitney ............................ 335/206

OTHER PUBLICATIONS

LV Control System, Bull. 1124R2, Square D, LA, 7-54, 8M, 11 pages.
Remote-Control Wiring System, Manual For Residential Wiring and Installation, General Electric, 1958, 32 pages.

Primary Examiner—L. T. Hix
Assistant Examiner—Stafford D. Schreyer
Attorney, Agent, or Firm—Manfred M. Warren; Robert B. Chickering; Glen R. Grunewald

[57] ABSTRACT

An electrical shock free submersible, remote control switch assembly for controlling the operation of electrically powered apparatus used with swimming pools, spas and the like is disclosed. The switch assembly includes a permanent magnet actuated reed switch mounted in a battery powered, low voltage electrical circuit. The low voltage circuit, in turn, is optically coupled by an opto-isolator to a relay circuit, which is used to open and close the high voltage circuit powering the electrical pumps, lights, blowers, etc. at the pool or spa.

8 Claims, 1 Drawing Figure

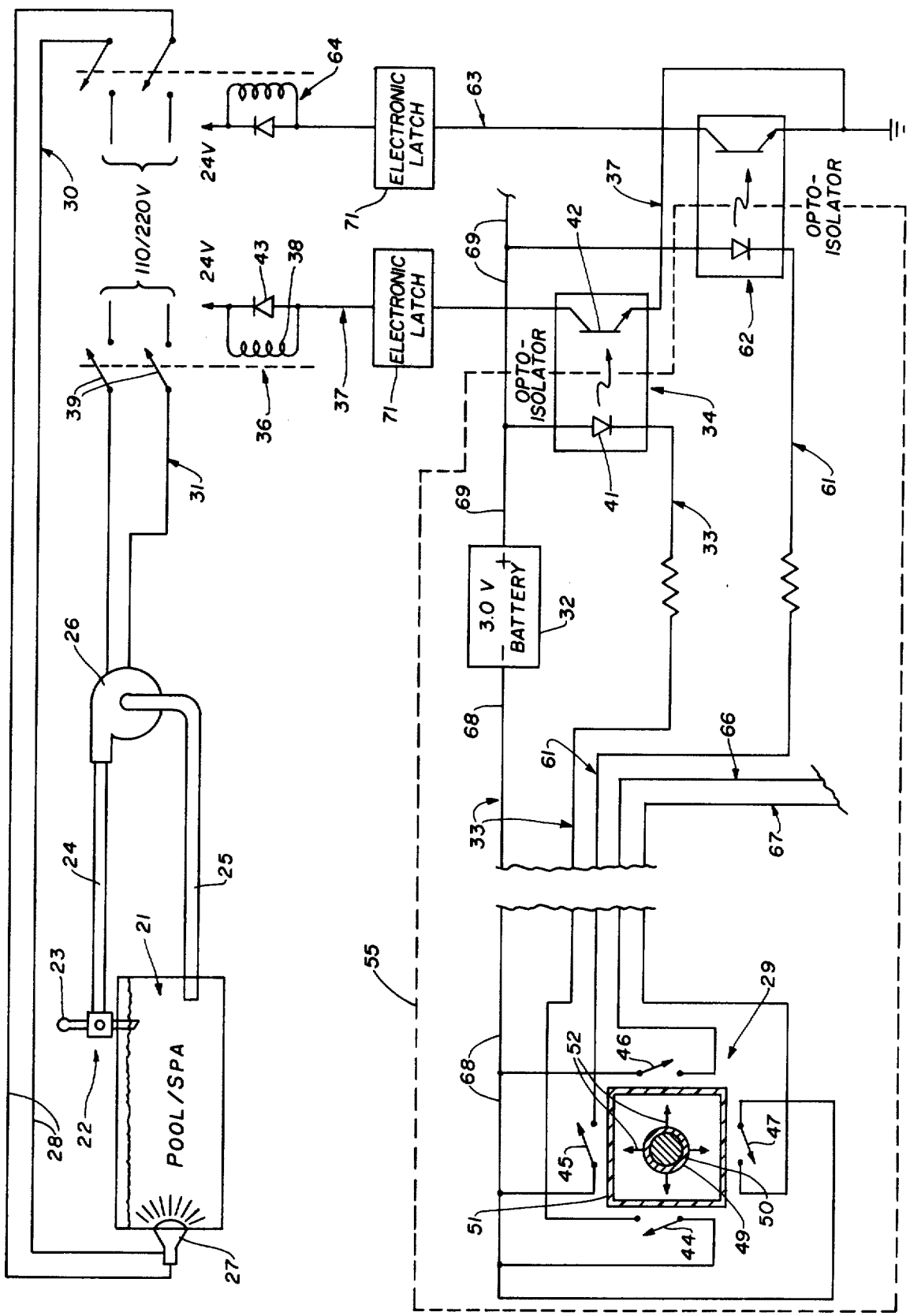

SUBMERSIBLE REMOTE CONTROL SWITCH ASSEMBLY

BACKGROUND OF THE INVENTION

The recent dramatic increase in popularity of spas and hot tubs having various electrically powered apparatus, such as hydro-massage apparatus, water filtration apparatus, and lighting, has resulted in the recognition of a serious safety problem in connection with the remote control of such apparatus from the area of the spa or pool of water. The problem of electrical shock as a result of leakage at remote control switches is a potentially serious one.

One approach to this problem has been to locate the remote control switch in the general vicinity of the spa, tub or pool, but far enough removed from the pool so as to require the user to get out of the pool and leave the area in which standing water might normally be present. This solution, however, inherently is somewhat inconvenient, and more importantly, it is not entirely safe, since the person using the remote control switching apparatus will often be literally dripping with water and well grounded when using the switch. Thus, there is still considerable potential for electrical shock.

Another approach has been to employ "air" switches for remote control of the spa water conditioning apparatus. Such air switches empoly a bellows system in order to insulate and isolate the user from the high voltage electrical circuitry. Unfortunately, such air switches are costly, somewhat bulky and unattractive, and cannot be operated when submerged in water.

OBJECTS AND SUMMARY OF THE INVENTION

A. Objects of the Invention

Accordingly, it is an object of the present invention to provide a submersible, remote control switch assembly for control of electrically powered apparatus typically used in connection with swimming pools, spas or the like, which switch assembly provides improved safety and isolation of the user from the possibility of electrical shock.

It is another object of the present invention to provide a submersible control switch assembly which can even be installed and safely operated under water.

Still a further object of the present invention is to provide a submersible remote control switch assembly which is easy and inexpensive to construct, is compact, may be readily incorporated into existing spa and swimming pool control systems, and requires minimum maintenance.

Another object of the present invention is to provide a method for isolating the user of a remote control switch assembly from potential electrical shock from the high voltage circuit which the switch assembly operates.

The submersible remote control switch assembly and method of the present invention have other objects and features of advantage which will become apparent from the accompanying drawing and are set forth in more detail in the following description of the preferred embodiments.

B. Summary of the Invention.

The submersible remote control switch assembly for control of electrically powered apparatus of the type typically used in connection with a swimming pool, spa or the like is comprised, briefly, of an independent, relatively low voltage source of electricity and low voltage electrical circuit coupled thereto, manually engageable switch means electrically coupled to the low voltage circuit and coated for submersion into a body of water, and light emitting means mounted in the low voltage circuit. Additionally, the light emitting means is optically coupled to light activated relay means mounted in an electrical control circuit, and the control circuit drives a relay coupled to a high voltage circuit for operation of the electrically powered apparatus at the pool or spa. The light emitting means and light activated relay means are preferably provided by an opto-isolator coupled to a relay that is used to open and close the high voltage circuit, while the switch means is preferably formed as a magnetically actuated reed switch.

The method of providing a safe water submersible remote control switch assembly is comprised of coupling an opto-isolator to a low voltage circuit and to relay means mounted in a control circuit, coupling the relay means to a high voltage circuit for operation of the water conditioning apparatus, and electrically coupling a magnetically actuated water impervious reed switch to the low voltage circuit.

DESCRIPTION OF THE DRAWING

The drawing is a top plan view of a schematic representation of a water submersible remote control switch assembly installed in a pool system and constructed in accordance with the present invention.

DESCRIPTION OF THE PREFERRED EMBODIMENTS

The shock free, submersible, remote control switch assembly of the present invention can be used with swimming pools, spas, hot tubs or similar recreational pool systems. As shown in the drawing, pool/spa 21 is provided with hydro-massage or aeration apparatus 22 having air intake 23 and coupled to conduit 24 to electrically powered water pump 26. Normally water will be supplied to pump 26 through conduit 25, which may draw water from pool/spa 21 or from another source. Also mounted in pool/spa 21 is light 27, which is connected by conductors 28 to a source of electricity.

In order to control the operation of pump 26, which is normally positioned at a location remote from spa 21, and light 27, a remote control switch means, generally designated 29, will be provided proximate pool/spa 21 and will be coupled to pump 26 for activation of the same. Most recreational pools will also include water heating apparatus and water filtering apparatus, and as used herein, the expression "electrically powered apparatus" shall include those kinds of electrically powered devices which are conventionally employed in connection with spas, swimming pools and hot tubs to heat, filter, agitate, etc. the pool water, and to light the pool or area around the pool.

As will be appreciated, virtually all electrically powered apparatus of the kind conventionally employed with recreational pool systems will be powered by a source of relatively high voltage electricity. Thus, pump 26 will be driven by electrical circuit 31, which is coupled to a high voltage source of electricity, for example, 110 or 220 volt source. Similarly, light 27 is mounted in circuit 30 to a high voltage source.

As will also be appreciated, remote control switch 29 can present a serious safety hazard if it is coupled directly to either of high voltage circuits 30 or 31. The water in and around pool/spa 21 will present a significant electrical shock hazard if switch 29 is directly coupled to the high voltage circuits, since leakage through the switch to the user in the presence of the pool water will almost certainly result in dangerous or even fatal electrical shocks. Although it may vary from person-to-person, the electrical shock hazard threshold is believed to be at about 5 volts. Electrical shock about that level can be dangerous to some people.

In order to provide enhanced safety, a submersible remote control switch assembly is provided in which the switch means 29 is electrically isolated from high voltage circuits 30 and 31 and yet is coupled optically to enable selective opening and closing of the high voltage circuits. Such electrical isolation and optical coupling can be provided by employing an independent low voltage source, such as battery 32, mounted and electrically connected in a low voltage circuit 33 to an opto-isolator, generally designated 34. As used herein, "independent" shall mean electrically independent of all high voltage sources. Manually engageable switch 29 is also electrically connected to low voltage circuit 33 to enable selective opening and closing of circuit 53. Opto-isolator 34 is electrically coupled to relay means, generally designated 36, in an intermediate or relay circuit 37. The coil 38 of relay 36 is disposed to drive the movable armature or switch portion 39 located in high voltage circuit 31. In order to prevent spurious triggering of relay means 36, a diode 43 can be coupled across coil 38 in a conventionally known manner. A single throw, double pole switch 39 is illustrated as often a 220 volt source will be used to power pump 26.

Opto-isolator 34 is comprised of a light emitting means that can be powered by a low voltage, such as a light emitting diode 41. Diode 41 is optically coupled for the transmission of light from diode 41 to light activated means 42. Preferably the light activated means 42 is provided by a single transistor or darlington pair interposed in 24 volt relay circuit 37.

Selective opening and closing of low voltage circuit 33 is preferably accomplished by forming switch means 29 as a stationary reed switch. As illustrated in the drawing, four reed switches 44, 45, 46 and 47 are positioned about movable arm member 49, which carries a permanent magnet 50. The reed switches are isolated against damage from water in the pool/spa by a water impervious barrier or coating 51.

In the preferred form, magnet 50 is mounted to arm 49 which can be deflected or tilted into close proximity to any selected one of reed switches 44-47, which will close the reed switches, as indicated by arrows 52. Arm 49 is biased away from the switches to the neutral position shown in the drawing. Moreover, switch 44-47 are normally biased to the open position. As thus constructed, permanent magnet 50 at reed switch means 29 can be selectively moved to a position closing any of switches 44-47. If the arm is released, biasing will move the magnet to the open position, thus causing the reed switches to open.

As shown in the drawing, reed switch 44 controls opening and closing of low voltage circuit 33, which operate relay 36 through the opto-isolator and, in turn, operates pump 26. Reed switch 45 controls opening and closing of a second low voltage circuit 61, which is coupled to battery 32 and a second opto-isolator 62 in turn is mounted in a second relay circuit 63 to drive second relay 64 and open or close high voltage circuit 30 for light 27. Switches 46 and 47 are mounted in third and fourth low voltage circuits 66 and 67, respectively, and the details of coupling of these circuits optically to third and fourth relay circuits and other electrically powered apparatus for pool/spa 21 are not shown for simplicity of illustration.

In the preferred form all of low voltage circuits 33, 61, 66 and 67 are electrically connected to battery 32 through common conductors 68 and 69. Moreover, all the relay circuits, such as circuits 37 and 63, are preferably provided with electronic latching means 71. Once the opto-isolators in the low voltage circuits are pulsed by closing of reed switches 44-47, the relays will change state and open, if closed, or close, if open. This minimizes the use of power from battery 32.

The user of the remote control switch of the present invention is insulated on four levels from the high voltage circuits 30 and 31. First, the reed switches provide a magnetic coupling or link with the user that will resist electrical leakage to the user. Moreover, the low voltage circuit 33 is of such low voltage, below 5 volts and preferably only 3 volts, that the potential for electrical shock from a low voltage circuit is essentially eliminated. Secondly, the opto-isolators provide optical coupling between low voltage circuits and the relay circuits. Thus, all of the components inside dotted line 55 are only optically coupled to the remaining components through opto-isolators 34 and 62.

The relay circuits are preferably medium voltage circuits, such as 24 volt circuits of the type conventionally used to power relays. Thus, the low voltage circuits are optically isolated from even the medium voltage relay circuits 37 and 63. Thirdly, the relay circuits themselves are isolated from high voltage by transformer coils, not shown. Fourthly, the relay circuits are electro-magnetically coupled to the high voltage circuits used to power the electrical equipment through the relays.

Accordingly, the submersible remote control switch assembly of the present invention interposes relays and transformers, opto-isolators and magnetic reed switches between the user and the high voltage used to power the water conditioning and lighting apparatus, with attendant greatly enhanced electrical safety. In fact, the switch means 29 can even be safely incorporated into the pool/spa at a position at or below the water line in the pool/spa.

As used herein the expression, "relatively low voltage" shall mean a voltage which is less than or about equal to the electrical shock hazard threshold, which is 5 volts. The expression "relatively high voltage" as used herein shall mean a voltage which shall present a significant electrical shock hazard and preferably shall mean 50 volts or greater.

The method of providing a safe, water submersible remote control switch assembly of the present invention is comprised of the steps of electrically coupling the light emitting sides of opto-isolators 34 and 62 to low voltage electrical circuits 33, 61 and electrically connecting the light receiving sides of the opto-isolators to relay means 36 and 64 in electrical relay circuits 37 and 63. The low voltage circuits preferably include a branch or conductor means which extends from the opto-isolators to a position remote thereof and adjacent to pool/spa 21. Additionally, the method of the present invention includes coupling relay means 36 and 64 to open and close high voltage circuits 31 and 30, and electrically coupling water impervious magnetically activated reed switch means 29 to the low voltage circuits at a position remote of the opto-isolator and proximate the pool/spa. The independent low voltage power source, battery 32, and the opto-isolators will ususally be located remote from the spa at a control panel for the various water-conditioning and lighting apparatus. Since the opto-isolators require very little power to drive the optical diodes, battery 32 will have a relatively long life and can be readily replaced.

What is claimed is:

1. Submersible remote control switch assembly for the control of electrically powered apparatus associated with a pool of water, such as a spa, said electrically powered apparatus being electrically connected to a source of relatively high voltage electricity by a high voltage circuit, wherein the improvement in said switch assembly is comprised of:
   an independent, relatively low voltage, source of electricity, and a low voltage circuit electrically coupled thereto;
   manually engageable switch means electrically coupled to and interposed in said low voltage circuit and formed for selective opening and closing of said low voltage circuit, said switch means being insulated for submersion into a body of water without interfering with said low voltage circuit;
   light emitting means mounted in said low voltage circuit and operable by said low voltage source of electricity upon closing of said low voltage circuit;
   relay means mounted in an electrical relay circuit and formed to enable opening and closing of said high voltage circuit for selective actuation of said electrically powered apparatus; and
   light activated means electrically connected to said relay circuit and optically coupled for the transmission of light from said light emitting means to said light activated means.

2. The submersible remote control switch assembly as defined in claim 1 wherein,
   said switch means is formed as a magnetically actuated reed switch.

3. The submersible remote control switch assembly as defined in claim 2 wherein,
   said reed switch is biased to an open position.

4. The submersible remote control switch assembly as defined in claim 2 wherein,
   said light emitting means and said light activated means are provided by an opto-isolator.

5. The submersible remote control switch assembly as defined in claim 1 wherein,
   said relatively low voltage source of electricity is provided by battery means,
   said switch means is a stationary reed switch coated with a water impervious coating and a permanent magnet selectively movable to a position operating said reed switch,
   said light emitting means and said light activated means are provided as light emitting diode means optically coupled to light activated transistor means, said light activated transistor means being electrically coupled in said relay circuit to said relay means.

6. The submersible remote control switch as defined in claim 1 wherein,
   said relatively low voltage source of electricity is a 3 volt battery;
   said electrical relay circuit include a 24 volt source of electricity; and
   said high voltage circuit includes a source of electricity having an electrical potential of at least 50 volts.

7. The submersible remote control switch as defined in claim 1, and
   a plurality of relatively high voltage circuits electrically coupled to power a plurality of electrical apparatus used in connection with said pool of water; and wherein
   said switch means includes a plurality of reed switches;
   said low voltage circuit includes a plurality of low voltage circuits each electrically connected to individual ones of said reed switches and a source of relatively low voltage;
   said relay circuit includes a plurality of relay circuits each having relay means therein coupled to open and close ones of said high voltage circuits; and
   said light emitting means and said light activated means are provided by a plurality of opto-isolators electrically connected on light emitting sides thereof to said low voltage circuits and electrically connected on light receiving sides to said relay circuits.

8. The method of providing a safe, water submersible, remote control switch assembly for control of electrically powered apparatus for a recreational pool which comprises the steps of:
   (a) electrically coupling an opto-isolator to a low voltage electrical circuit, said low voltage electrical circuit including conductor means extended from said opto-isolator to a remote position therefrom;
   (b) electrically coupling said opto-isolator to relay means in an electrical relay circuit;
   (c) coupling said relay means to open and close a high voltage circuit electrically connected to power said electrically powered apparatus; and
   (d) electrically coupling water impervious magnetically activated reed switch means to said low voltage circuit at said remote position.

* * * * *